(12) United States Patent
Mukai et al.

(10) Patent No.: US 8,921,157 B2
(45) Date of Patent: Dec. 30, 2014

(54) PRINTED SUBSTRATE MANUFACTURING EQUIPMENT AND MANUFACTURING METHOD

(75) Inventors: Noriaki Mukai, Toride (JP); Masaru Mitsumoto, Ryugasaki (JP); Makoto Homma, Katori (JP)

(73) Assignee: Hitachi, Ltd., Tokyo (JP)

( * ) Notice: Subject to any disclaimer, the term of this patent is extended or adjusted under 35 U.S.C. 154(b) by 195 days.

(21) Appl. No.: 13/426,687

(22) Filed: Mar. 22, 2012

(65) Prior Publication Data

US 2012/0244666 A1    Sep. 27, 2012

(30) Foreign Application Priority Data

Mar. 25, 2011  (JP) ................. 2011-067147

(51) Int. Cl.
| | |
|---|---|
| H01L 21/00 | (2006.01) |
| H01L 21/44 | (2006.01) |
| H05K 3/34 | (2006.01) |
| H01L 21/56 | (2006.01) |
| H01L 23/00 | (2006.01) |
| H05K 3/30 | (2006.01) |

(52) U.S. Cl.
CPC ............ *H05K 3/3436* (2013.01); *H01L 21/563* (2013.01); *H01L 24/75* (2013.01); *H01L 24/81* (2013.01); *H01L 24/83* (2013.01); *H01L 23/564* (2013.01); *H01L 2224/16225* (2013.01); *H01L 2224/75272* (2013.01); *H01L 2224/75281* (2013.01); *H01L 2224/81192* (2013.01); *H01L 2224/81815* (2013.01); *H01L 2224/83192* (2013.01); *H01L 2224/8388* (2013.01); *H01L 2224/83951* (2013.01); *H01L 2224/9211* (2013.01); *H01L 2924/01082* (2013.01); *H05K 3/303* (2013.01); *H05K 2201/0129* (2013.01); *H05K 2201/10674* (2013.01); *H05K 2201/10977* (2013.01); *H05K 2203/167* (2013.01); *H01L 2924/01005* (2013.01); *H01L 2924/01006* (2013.01); *H01L 2924/01033* (2013.01); *H01L 2924/014* (2013.01); *H01L 2224/81191* (2013.01); *H01L 2224/83191* (2013.01); *H01L 2224/73104* (2013.01)

USPC ................. 438/108; 438/106; 257/E23.069; 257/E21.122; 257/E21.519

(58) Field of Classification Search
CPC ... H01L 21/4853; H01L 21/56; H01L 21/563; H01L 2225/1058; H01L 24/75; H01L 24/81; H01L 24/83; H01L 23/564
USPC .......... 438/106, 108, 456, 613; 257/E23.069, 257/21.122, 21.519
See application file for complete search history.

(56) References Cited

U.S. PATENT DOCUMENTS

2007/0102827 A1 *  5/2007  Hogerton et al. ............. 257/778

FOREIGN PATENT DOCUMENTS

JP    2010-118634    5/2010

* cited by examiner

*Primary Examiner* — Michelle Mandala
(74) *Attorney, Agent, or Firm* — Antonelli, Terry, Stout & Kraus, LLP.

(57) ABSTRACT

Solder bumps are formed on a plurality of electrode parts of a printed substrate and a semiconductor chip is loaded on the printed substrate via the plurality of solder bumps. In this case, a thermoplastic film is prepared as an underfill that covers a surface of the printed substrate on which the solder bumps are formed. In the film, parts corresponding to the solder bumps are removed and a peripheral edge of a part on which the semiconductor chip will be loaded has a protruded form. After the printed substrate has been covered with the film, the film is bonded onto the board and the semiconductor chip is loaded on the printed substrate and carried into a reflow furnace. In the reflow furnace, heat and pressure are applied to fuse the solder bumps.

4 Claims, 2 Drawing Sheets

PRINTED SUBSTRATE MANUFACTURING EQUIPMENT AND MANUFACTURING METHOD

INCORPORATION BY REFERENCE

The present application claims priority from Japanese Application P2011-067147 filed on Mar. 25, 2011, the content of which is hereby incorporated by reference into this application.

BACKGROUND OF THE INVENTION

1. Field of the Invention

The present invention relates to printed substrate manufacturing equipment and manufacturing method, and more particularly relates to printed substrate manufacturing equipment and manufacturing method favorably used to mount a semiconductor chip onto a printed substrate.

2. Description of the Related Art

In flip chip bonding in a printed substrate, a solder ball is adhered to a connection pad which is formed on the printed substrate and a semiconductor chip is mounted on the substrate via the solder ball. When the semiconductor chip is mounted on the printed substrate by the above-mentioned flip chip bonding method, a gap G is formed between the semiconductor chip and the printed substrate in accordance with the height of the solder ball which is adhered to the connection pad. Therefore, such a problem may occur that the supporting force of the semiconductor chip is reduced and hence a crack is generated in a solder ring part of the solder ball. In particular, when the temperature is greatly changed, thermal stress may be exerted on the solder ball and the crack may be generated in the solder ball due to the thermal stress because thermal expansion coefficients of the semiconductor chip and the printed substrate are different from each other.

Thus, it has been practiced so far to inject an underfill liquid which is a liquid substance into the gap G generated between the semiconductor chip and the printed substrate by using a dispenser in order to stably support the semiconductor chip as disclosed, for example, in Japanese Patent Application Laid-Open No. 2010-118634. Since the underfill liquid is injected into the gap G, it is desirable to prevent the liquid from leaking to the outside and hence a spill prevention dam is formed on an edge of the board.

In a printed substrate described in Japanese Patent Application Laid-Open No. 2010-118634, a dispenser is used to form a spill prevention dam. Hitherto, a space between respective bumps has been wide enough to use the dispenser. However, the space between the bumps is reduced as the chip is refined and it becomes difficult to inject the underfill liquid by using the dispenser. Thus, formation of the underfill is difficult, which makes it also difficult to prevent generation of a crack due to thermal stress exerted between the semiconductor chip and the substrate. Thus, a substitutive method for the method of injecting the underfill liquid using the dispenser is searched for.

BRIEF SUMMARY OF THE INVENTION

The present invention has been made in view of the drawbacks of the above mentioned related art and an object of the present invention is to fix a printed substrate and a semiconductor chip to each other by filling a gap between them so as to obtain the same effect as that obtained when an underfill liquid is used. Another object is to implement a highly accurate printed substrate that prevents generation of a crack.

In order to solve the above mentioned problems, the present invention provides a printed substrate manufacturing method of forming solder bumps on a plurality of electrode parts of a printed substrate and loading a semiconductor chip on the printed substrate via the plurality of solder bumps, including preparing a thermoplastic film to be used as an underfill that covers a surface of the printed substrate on which the solder bumps are formed, wherein parts of the film corresponding to the solder bumps are removed and a peripheral edge of a part of the film on which the semiconductor chip will be loaded has a protruded form, covering the printed substrate with the film and thereafter applying the film onto the board, loading the semiconductor chip on the printed substrate and carrying the board into a reflow furnace and applying heat and pressure to fuse the solder bumps in the reflow furnace.

In the above mentioned printed substrate manufacturing method, preferably, in preparing the film, after the film which is in a rolled-up state has been cut into a section of a predetermined size, the film so cut is carried to a film drilling unit using a film carrying jig, drilling is performed on a part of the film corresponding to each solder bump formed on the printed substrate by the film drilling unit, and then the film is inverted together with the film carrying jig.

In order to solve the above mentioned problems, the present invention also provides a printed substrate manufacturing equipment, including a film supply unit on which a thermoplastic film to be used as an underfill is wound in roll, a film drilling unit for drilling a part of the film supplied from the film supply unit corresponding to the position of a solder bump formed on a printed substrate, a film inversion unit for inverting the film together with a film carrying jig that holds the film and a film bonding unit for bonding the inverted film onto the printed substrate, wherein the film bonding unit includes an upper table for holding the inverted film carrying jig and film, a lower table on which the printed substrate is placed and which includes a heater for heating the printed substrate, and a driving device for vertically moving the upper table and the lower table.

Preferably, the above mentioned printed substrate manufacturing device further includes a reflow furnace into which a semiconductor chip which is loaded on the printed substrate to which the film has been bonded by the film bonding unit is carried to fuse the solder bump to fix the semiconductor chip to the printed substrate.

DETAILED DESCRIPTION OF THE INVENTION

Figure 1:
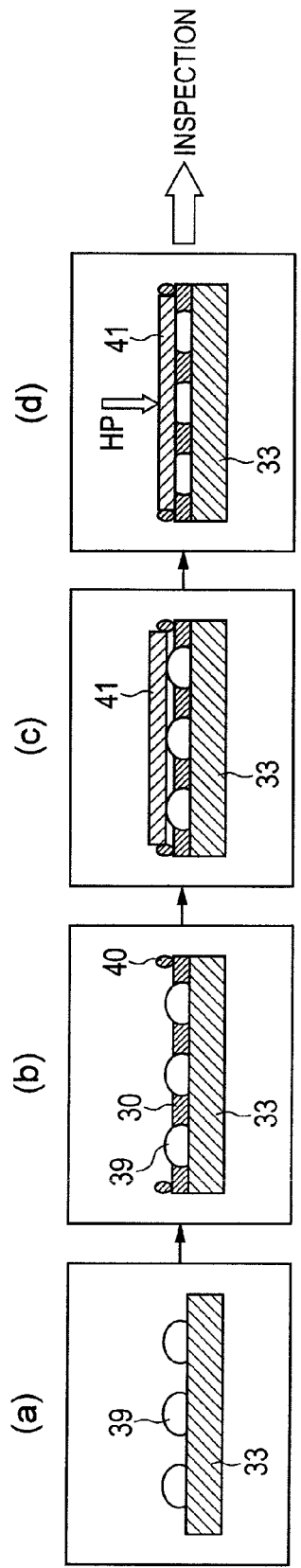
FIG. 1 is a diagram schematically illustrating steps of mounting a semiconductor chip to a printed substrate according to one embodiment of the present invention.

Printed substrate manufacturing equipment and manufacturing method according to the present invention will be described with reference to the accompanying drawings. FIG. 1 is a diagram for describing one embodiment of a manufacturing method for a printed substrate 33 according to the present invention, illustrating respective steps of mounting a semiconductor chip 41 to the printed substrate 33. Although not illustrated in FIG. 1, solder bumps 39 are printed on a surface of the printed substrate 33 by using a solder ball printer and reflow soldering is performed to fix the bumps onto the surface of the printed substrate 33 in a pre-process of manufacturing.

As illustrated in portion (a) of FIG. 1, the printed substrate 33 with the solder bumps 39 formed is carried into an underfill formation unit and is loaded on a lower table 34 (step S1). When the printed substrate 33 is loaded on the lower table 34, an underfill film (hereinafter, referred to as a film as the case may be) 30 on which drilling is performed in advance by a CVD (Chemical Vapor Deposition) device after the form of each solder bump 39 is supplied from a not-illustrated underfill film supply device.

A protrusion (protruded part) 40 is formed on an end (for example, a peripheral edge) of the film 30. The protrusion 40 is formed so as to prevent the semiconductor chip 41 from moving on the printed substrate 33 regardless of application of vibration or the like to the printed substrate 33, when it is intended to move the semiconductor chip 41 in a state that is loaded on the printed substrate 33.

The film 30 is 5 to 20 μm in thickness and thermoplastic. The film 30 is made adhesive with heat to adhere the semiconductor chip 41 to the printed substrate 33. Marks for alignment are made on the film 30 and the printed substrate 33. An underfill film formation unit (for example, a film bonding device) 50 includes an imaging camera (for example, a two-field camera with upper and lower fields) 32 for detecting these marks and takes a picture of the position of each mark by the camera 32. The picture that the camera 32 has taken is sent to a not-illustrated control unit and is subjected to image processing by the control unit. Then, an amount of misalignment between the mark positions is obtained and a lower table 34 is horizontally moved to align the film 30 with the printed substrate 33.

After alignment of the film 30 with the printed substrate 33 has been completed as illustrated in portion (b) of FIG. 1, the film 30 is lowered toward the surface of the printed substrate 33. Then, the printed substrate 33 is covered with the film 30 except parts corresponding to the solder bumps 39 (step S2). The semiconductor chip 41 is loaded on the solder bumps 39 after the printed substrate 33 has been covered with the film 30 as illustrated in portion (c) of FIG. 1 (step S3).

Pictures of alignment marks on the semiconductor chip 41 and the solder bumps 39 are taken by the camera 32 also when the semiconductor chip 41 is to be aligned with the solder bumps 39. Then, an amount of misalignment between them is measured as in the case in alignment of the film 30 with the printed substrate 33 and a grip of the semiconductor chip 41 is horizontally moved in accordance with the amount of misalignment to align the semiconductor chip 41 with the solder bumps 39. If the printed substrate 33 is moved after the semiconductor chip 41 has been mounted on it, the possibility of occurrence of misalignment will be increased because the semiconductor chip 41 is simply placed on the solder bumps 39. Thus, the protruded part is formed on the end of the film 30 on the side on which the semiconductor chip 41 is to be loaded. As an alternative, the protruded part may be formed when drilling is performed on the film 30.

After the semiconductor chip 41 has been mounted on the printed substrate 33 and a mounted state thereof has been inspected, the printed substrate 33 is carried to a reflow furnace. The underfill film 30 is pressed downward in a direction of an arrow in the reflow furnace as illustrated in portion (d) of FIG. 1. Heating is performed simultaneously with pressing. The printed substrate 33 and the semiconductor chip 41 are adhered and fixed to each other by heating and pressing (HP) the film 30 (step S4). After fixing of the semiconductor chip 41 onto the printed substrate 33 has been completed, the printed substrate 33 is carried to a process of inspection.

Figure 2:
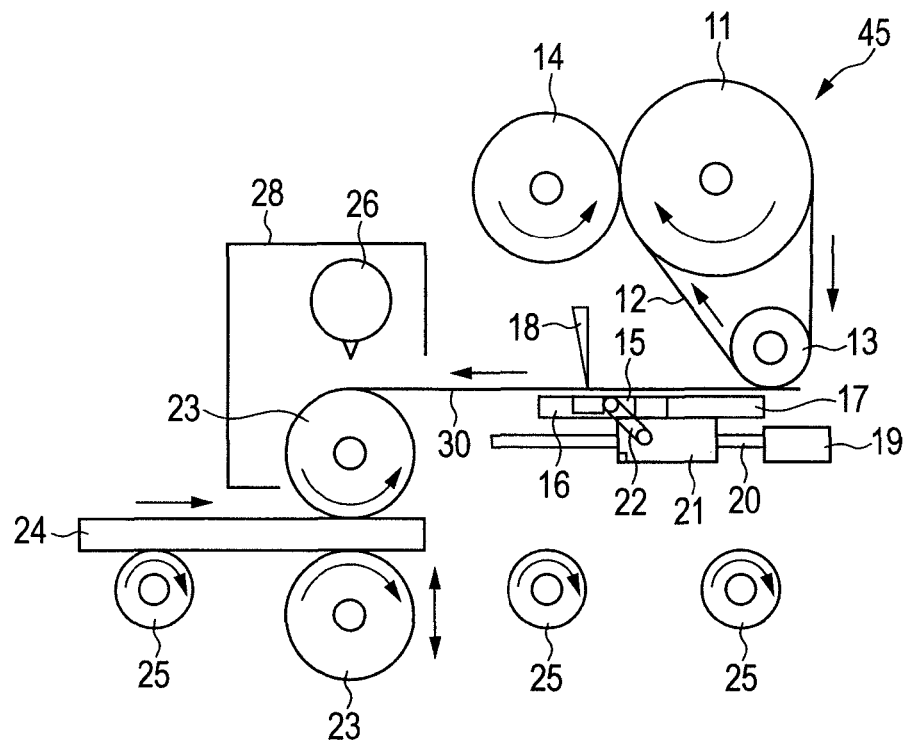
FIG. 2 is a schematic diagram illustrating a part of a printed substrate manufacturing equipment according to one embodiment of the present invention, that is, a part configured to deliver a film to be used as an underfill to a film carrying jig.

FIG. 2 illustrates a forming device 45 for the underfill film (film) 30. In an example illustrated in FIG. 2, the film 30 is formed as a sheet-shaped roll. A film roll 11 includes a cover film 12 and the underfill film 30. The cover film 12 and the underfill film 30 are laminated in order from within.

A guide roll 13 is disposed below the film roll 11 in order to carry the film 30 from the film roll 11 onto a carrying surface. The guide roll 13 is used to peel off the cover film 12. The peeled-off cover film 12 is taken up on a take-up roll 14 which is disposed adjacent to the film roll 11. Drive units for the film roll 11 and the take-up roll 14 include a not-illustrated torque adjuster respectively, for adjusting torque in accordance with the residual quantity of the film 30. The torque is adjusted by the torque adjuster, by which it is allowed to carry the film 30 in a state that its tension is maintained constant.

A leading end holding member 15 and a trailing end holding member 16 for carrying the film 30 in a state that predetermined areas of the leading and trailing ends of the film 30 are sucked and adsorbed to them are disposed under the guide roll 13. A vacuum chamber is disposed in the leading end holding member 15 and an adsorption hole is formed in its upper surface. The vacuum chamber is connected to a not-illustrated vacuum pump. When the vacuum pump is driven, the leading end of the film is sucked and adsorbed to the upper surface of the leading end holding member 15. That is, the film 30 is held on the leading end holding member 15 by using a vacuum adsorption mechanism.

The leading end holding member 15 is supported on a movable part 21 of a ball screw 20 which is disposed under the leading end holding member 15. The ball screw 20 is directly connected to a servo motor 19. The leading end holding member 15 which is supported on the movable part 21 of the ball screw 20 is moved in a lateral direction (a film carrying direction) by driving the servo motor 19. An air cylinder 17 is connected to the movable part 21. The air cylinder 17 is allowed to carry the leading end of the film 30 to a position where the film 30 is adjacent to one of a pair of pressing rollers 23 that configure a pressing unit for pressing the film 30.

A vacuum chamber is disposed in the trailing end holding member 16 and an adsorption hole is formed in its upper surface as in the case of the leading end holding member 15. A groove which extends in a width direction is formed in the member 16. The groove is also used as a cutter pedestal when the film 30 will be cut in the width direction by a cutter mechanism 18. The cutter mechanism 18 is disposed above the trailing end holding member 16 and is configured to be moved in the width direction by a rodless cylinder or the like. The cutter mechanism 18 is used to cut the film 30 in the width direction.

Since the movable part 21 of the ball screw 20 supports the leading end holding member 15, the film 30 is carried with accuracy. In addition, since a coupling member 22 is rotated by driving a rotary actuator disposed on the movable part 21, it is allowed to retreat the trailing end holding member 16 downward from the film carrying surface.

Each pressing roller 23 is configured by covering an outer periphery of a metal roll with highly heat-resistant rubber (silicon rubber or the like) so as to have a thickness of about 1.2 mm. When a voltage is applied to the film 30 from an electrode 26 included in a static electricity generator 28, the pressing roller 23 holds the film 30 on its surface by electrostatic adsorption. Therefore, if the rubber that covers the outer peripheral of the roller 23 is silicon rubber, its electric resistance will be increased. However, since the outer periphery covering rubber has such a thin thickness as about 1.2 mm, its influence on the electrostatic adsorption is little. It goes without saying that the effect of electrostatic adsorption will be increased by using heat-resistant conductive rubber.

The pair of pressing rollers 23 are vertically disposed so as to pinch a film carrying jig 24 which is carried on a carrier roller 25 from above and from below. A not-illustrated air cylinder is coupled to each of the vertically disposed pair of pressing rollers 23 and the pressing rollers 23 are vertically moved by driving the air cylinder. Here, a metal part of each pressing roller 23 is grounded.

Next, a film bonding operation will be described. In preparation for bonding of the film 30, the film 30 is manually drawn out from the film roll 11 and is delivered to the guide roll 13. The guide roll 13 peels off the cover film 12 as described above. The peeled-off cover film 12 is taken up on the take-up roll 14. The remaining film 30 is drawn out until it reaches the leading end of the trailing end holding member 16 and its rear surface side is sucked and adsorbed to the leading end holding member 15 and the trailing end holding member 16.

In the above mentioned case, a motor which is the drive unit connected to the film roll 11 and the take-up roll 14 is operated to exert a constant tension on the film 30. In the above-mentioned state, the groove part in the trailing end holding member 16 is positioned such that a cutting blade of the cutter mechanism 18 passes along it. Then, the cutter mechanism 18 is moved in the width direction to cut the film 30. When cutting of the film 30 has been completed, sucking and adsorbing force of the trailing end holding member 16 that has adsorbed the film 30 so far is released and a cut-off piece of the film 30 is discarded. In the above-mentioned case, the film 30 is sucked and adsorbed to the leading end holding member 15 in a state that the leading end of the film 30 is protruded beyond the leading end of the leading end holding member 15 by about 10 mm, by which preparation for the operation of bonding the film 30 is completed.

In a state that preparation for application of the film 30 has been completed, both the pressing rollers 23 which are positioned on and under the substrate carrying surface are at upper positions and are rotating in a substrate carrying direction in a state that the rollers 23 are heated by built-in heaters. An upper surface of the lower pressing roller 23 is in contact with the film carrying jig 24 to carry the film carrying jig 24 from the left side toward the right side in an example illustrated in FIG. 2.

In the operation of bonding the film 30, first, the servo motor 19 is operated to move the movable part 21 of the ball screw 20 to the neighbourhood of the pressing rollers 23. When a rotary actuator disposed on the trailing end holding member 16 is driven, the coupling member 22 rotates to retreat the trailing end holding member 16 downward from the film carrying surface.

Next, the air cylinder 17 is operated to move the leading end holding member 15 until the leading end of the film 30 reaches a position around the center of the upper surface of the upper pressing roller 23. After the film 30 has been situated at the above-mentioned predetermined position, a high voltage is applied from a not-illustrated static electricity generation source to the electrode 26. In the above mentioned case, the leading end of the film 30 is situated between the electrode 26 and the upper pressing roller 23. Thus, a film leading end part which is protruded beyond the leading end holding member 15 is charged and adsorbed to the grounded upper pressing roller 23.

The upper pressing roller 23 is rotated in a carrying direction of the film carrying jig 24 and carries the adsorbed film 30 downward (toward the film carrying jig 24). When sucking and adsorbing force of the leading end holding member 15 is released, the film 30 is carried toward the printed substrate 33 with rotation of the upper pressing roller 23. Then, the air cylinder 17 and the movable part 21 are operated to return the leading end holding member 15 that has delivered the film 30 to the pressing roller 23 to a position under the guide roll 13. At the same time, the rotary actuator is driven to rotate the coupling member 22 so as to also return the retreated trailing end holding member 16 to the position of the film carrying surface.

After the film 30 has been carried to a position (where the film 30 is brought into contact with the surface of the carried film carrying jig 24) directly under the upper pressing roller 23, rotation of the pressing rollers 23 is stopped. Then, the film 30 which is positioned above the leading end holding member 15 and the trailing end holding member 16 is held in a state that it is sucked and adsorbed to the respective holding members 15 and 16 at its leading and trailing ends. The cutter mechanism 18 is driven to cut the film 30 in the width direction. In the above-mentioned case, positions of the cutter mechanism 18 and the trailing end holding member 16 are adjusted such that the cut film 30 has a length which is long enough to be bonded to the printed substrate 33.

As an alternative, the cutter mechanism 18, the leading end holding member 15 and the trailing end holding member 16 may be operated in synchronization with carrying of the film 30 without stopping the rotation of the pressing rollers 23 so as to cut the film 30 in an adsorptive-held state. The film carrying jig 24 is formed longer than the printed substrate 33 to which the film 30 will be actually bonded.

After the film 30 has been cut to a predetermined length, the carrier roller 25 carries the film carrying jig 24 to a film bonding position (where the film will be bonded to the substrate). After the film carrying jig 24 has reached the film bonding position, a heightwise position of the lower pressing roller 23 is left as it is and only the upper pressing roller 23 is lowered (toward the lower pressing roller 23). As a result, the film 30 comes into contact with the surface of the film carrying jig 24 and then pressing is started. In the above-mentioned process, the film 30 is carried to the pressing rollers 23 simultaneously with carrying of the film carrying jig 24. However, since the trailing end holding member 16 is also moved toward the pressing rollers 23 in synchronization with carrying of the film 30, the tension exerted on the film is made constant.

The film 30 is gradually pressed onto the film carrying jig 24 with rotation of the pressing rollers 23. On the other hand, when the trailing end holding member 16 to which the film 30 is adsorbed reaches the vicinity of the pressing rollers 23, a high voltage is applied to the electrode 26 of the static electricity generator 28 as in the case that the leading end of the film 30 is delivered from the leading end holding member 15 to the pressing roller 23. When the high voltage is applied to the electrode 26, the trailing end of the film 30 which is situated under the electrode 26 is charged and electrostatically adsorbed to the pressing roller 23.

After the trailing end of the film 30 has been wholly delivered to the pressing roller 23, the sucking and adsorbing force of the trailing end holding member 16 is released. Then, the coupling member 22 is rotated to retreat the member 16 downward. On the other hand, the leading end holding member 15 is in a state that the leading end of a film 30 to be bonded next is sucked and adsorbed to it and is moved to the vicinity of the pressing roller 23 in a state that the film 30 is stuck and adsorbed to it.

Since the trailing end of the film 30 is electrostatically adsorbed to the pressing roller 23, close contact of the film 30 with the film carrying jig 24 is allowed without letting the film 30 hang down from the surface of the film carrying jig 24. Thus, a film-bonding part may not be crumpled and any bubble may not enter it in pressing. Since the lower pressing roller 23 is grounded, the static electricity of the film 30 which is held on the upper pressing roller 23 is discharged when the film 30 comes into contact with the film carrying jig 24.

After the entire surface of the film 30 has been pressed onto the surface of the film carrying jig 24, the upper pressing roller 23 is moved upward to deliver the next film 30 from the leading end holding member 15 to the upper pressing roller 23. After the leading end of the film 30 has been delivered to the upper pressing roller 23, the leading end holding member 15 moves to a position under the guide roll 13. At the same time, the trailing end holding member 16 which is in a retreated state is also returned to the position of the film carrying surface. As a result, a series of processes of the film bonding operation is completed.

In the above mentioned embodiment, the leading and trailing ends of the film 30 are electrostatically adsorbed to the holding members 15 and 16 in order to deliver the film 30 to the pressing roller 23. As an alternative, the entire surface of the film 30 may be electrostatically charged to be adsorbed to the pressing roller 23. In addition, as a substitution for the vacuum adsorption mechanism which is used as the film holding mechanism included within the leading end holding member 15 and the trailing end holding member 16, an electrostatic adsorption holding mechanism may be used as in the case of the unit for making the film 30 adsorb to the pressing roller 23.

The film 30 which is attached onto the film carrying jig 24 is sent to a not-illustrated drilling unit in which, then, drilling is performed on a part corresponding to the electrode part (the part corresponding to the part of forming the solder bump 39) on the printed substrate 33. Drilling is performed by a not-illustrated drilling machine. Before performing drilling, a protrusion is formed on an end of the film 30 by using a press machine. Owing to formation of the protrusion, the semiconductor chip 41 may not be moved with vibration or the like when the printed substrate 33 is to be moved simply by placing the semiconductor chip 41 on the printed substrate 30 without fixing it to the substrate. As an alternative, the protrusion may be formed when the film 30 is bonded onto the printed substrate 33.

Figure 3:
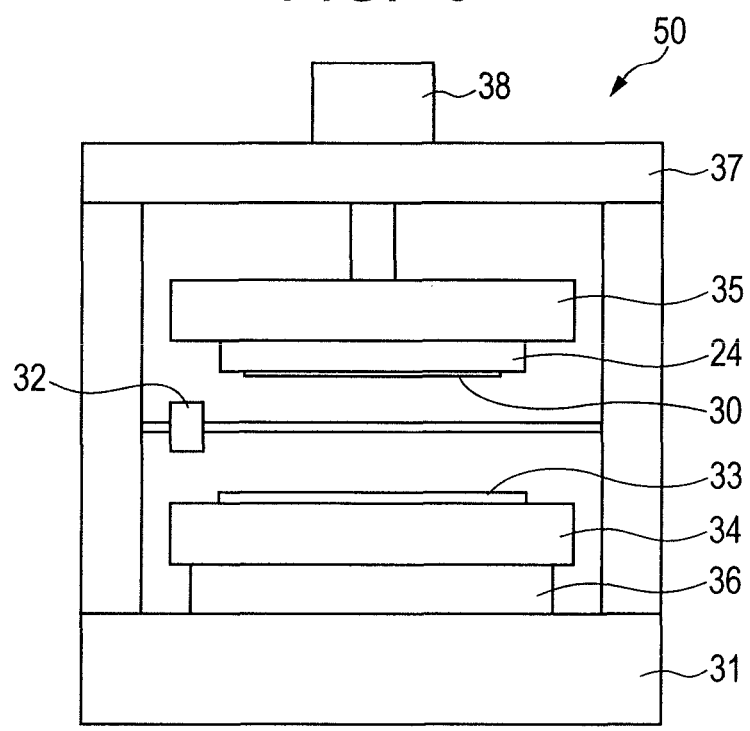
FIG. 3 is a schematic diagram illustrating a part of the printed substrate manufacturing equipment according to one embodiment of the present invention, that is, a part configured to apply the film to be used as the underfill to the printed substrate.

The drilled film 30 is carried to the film bonding device 50 in order to load the drilled film 30 on the printed substrate 33. FIG. 3 illustrates a schematic configuration of the film bonding device 50. In the film bonding device 50, the lower table 34 on which the printed substrate 33 will be loaded is disposed on a base 31.

The lower table 34 includes a not-illustrated XYΘ table for moving the lower table 34 in a horizontal plane and an XYΘ table driving mechanism 36. Supports are disposed on four corners of the base 31 and an upper table support beam 37 for holding an upper table 35 is attached onto the supports. A driving device 38 for vertically moving the upper table 35 is disposed on the support beam 37. The upper table 35 is attached to the driving device 38. The two-field camera 32 with upper and lower fields is disposed between the upper table 35 and the lower table 34 to be horizontally movable.

Before the film carrying jig 24 with the film 30 attached is carried into the film bonding device 50, a surface of the film 30 to be held is inverted together with the film carrying jig 24 by a not-illustrated inverting device. The film carrying jig 24 is carried into the film bonding device 50 in an inverted state. Then, the film carrying jig 24 is held under the upper table 35 which is disposed in opposition to the lower table 34 on which the printed substrate 33 is loaded with the film surface turned downward. In the above mentioned case, a negative pressure is applied to a not-illustrated surface of the upper table 35 to hold the film 30 under the upper table 35 by vacuum adsorption together with the film carrying jig 24.

Pictures of alignment marks which are formed in advance on the surface of the film 30 and the surface of the printed substrate 33 are taken by the two-field camera 32 with upper and lower fields. A not-illustrated control unit performs image processing on the taken pictures to obtain an amount of misalignment between the alignment marks on the surfaces of the film 30 and the substrate 33. The lower table 34 is horizontally moved for alignment on the basis of the obtained misalignment amount. Since the lower table 34 includes a heater, it is allowed to heat the printed substrate 33 to a predetermined temperature. When the printed substrate 33 is loaded on the lower table 34, the heater is turned on to warm the printed substrate 33. After the pictures of the alignment marks have been taken, the two-field camera 32 with upper and lower fields is retreated from surfaces of the upper table 35 and lower table 34.

At the completion of alignment, the table vertically driving mechanism 38 is operated to lower the upper table 35 with the film 30 supported. The film 30 is bonded onto the surface of the printed substrate 33 while applying a predetermined pressure onto the surface of the printed substrate 33. That is, heat and pressure are applied to temporarily fix the underfill film (film) 30 onto the surface of the printed substrate 33 except the electrode part of the printed substrate 33. In the above mentioned description, a process of forming the protrusion 40 on the end (the part corresponding to an end (for example, a peripheral edge) of the semiconductor chip) is performed before the process of drilling the film 30 is performed. As an alternative, the protrusion to which the end of the semiconductor chip 41 is fixed may be formed when performing the process of bonding the film 30 onto the printed substrate 33.

At the completion of bonding of the film 30, the flow proceeds to a process of mounting the semiconductor chip 41 on the printed substrate 33. In mounting the semiconductor chip 41 on the printed substrate 33, the position of the electrode of the semiconductor chip 41 is measured in advance by using the camera 32. The semiconductor chip 41 is mounted on the surface of the printed substrate 33 with the underfill film 30 formed by using an existing chip mounter with robot hand.

The printed substrate 33 with the semiconductor chip 42 mounted is carried into the reflow furnace in which, then, a soldering chip is fused to fixedly bond the semiconductor chip 42 to the printed substrate 33. Since the semiconductor chip 41 is not fixed to the printed substrate in carrying the substrate 33 into the reflow furnace, the protrusion 40 is formed on the end of the underfill film 30 to hold the end of the semiconductor chip 41 so as to avoid movement of the semiconductor chip 41.

In the above mentioned embodiment, before the semiconductor chip is pressed onto the printed substrate, the underfill film is formed after the form of the printed substrate from which the electrode part is eliminated and the underfill film so formed is bonded onto the surface of the printed substrate to mount the semiconductor chip in a predetermined position, in place of an existing method of mounting a semiconductor chip on a printed substrate and then injecting an underfill liquid into between the printed substrate and the semiconductor chip. Owing to the above mentioned arrangement, it may become possible to cope with a reduction in space between electrodes which is caused by refinement. That is, it may become possible to firmly fix the semiconductor chip to the printed substrate regardless of presence of such a narrow space between the printed substrate and the semiconductor chip that a capillary phenomenon which is utilized when a liquefied underfill is used may not occur.

According to the present invention, since the underfill is formed by a plastic film, it may become possible to fix the substrate and the semiconductor chip to each other so as to obtain the same effect as that obtained when an underfill liquid is used. In addition, since it may become possible to surely fix the semiconductor chip and the printed substrate to each other with the underfill film, it may become possible to avoid generation of a crack due to thermal stress or the like.

What is claimed is:

1. A printed substrate manufacturing method of forming solder bumps on a plurality of electrode parts of a printed substrate and mounting a semiconductor chip on the printed substrate via the plurality of solder bumps, comprising:
   preparing a thermoplastic film to be used as an underfill that covers a surface of the printed substrate on which the solder bumps are formed, wherein parts of the film corresponding to the solder bumps are removed and a peripheral edge of a part of the film on which the semiconductor chip will be mounted has a protruded form for preventing movement of the semiconductor chip on the printed substrate;
   covering the printed substrate with the film and thereafter bonding the film onto the printed substrate, wherein the parts of the film corresponding to the solder bumps are removed before covering the printed substrate with the film;
   mounting the semiconductor chip on the printed substrate and carrying the printed substrate into a reflow furnace; and
   bonding by applying heat and pressure to fuse the solder bumps in the reflow furnace.

2. A method of manufacturing a printed substrate comprising steps of:
   preparing an underfill film by forming a plurality of holes through the film and forming at least one protruded form on a peripheral edge of the film, wherein the at least one protruded form is disposed on a first surface of the film, and the at least one protruded form extends away from the first surface of the film;
   after preparing the film, covering a printed substrate with the film by aligning a plurality of solder bumps on the printed substrate with the plurality of holes through the film and thereafter bonding the film onto the printed substrate;
   placing a semiconductor chip on the printed substrate via the plurality of solder bumps and carrying the printed substrate into a reflow furnace; and
   applying heat and pressure in the reflow furnace to adhere the semiconductor chip to the printed substrate.

3. The method of manufacturing a printed substrate according to claim 2, wherein the step of preparing the film further comprises drawing the film from a film roll, cutting the film to a predetermined size, and drilling the plurality of holes through the film.

4. The printed substrate manufacturing method according to claim 2, wherein a second surface of the film faces the printed substrate after covering the printed substrate with the film, and the second surface of the film forms one side of the film and the first surface of the film forms an opposite side of the film.

* * * * *